(12) United States Patent
He

(10) Patent No.: US 10,989,402 B2
(45) Date of Patent: Apr. 27, 2021

(54) FLUORESCENT GLUE FOR LED LIGHTING BAR AND LED BULB LAMP USING THE LED LIGHTING BAR

(71) Applicant: SHENZHEN FENGGONG CULTURE COMMUNICATION CO., LTD., Guangdong (CN)

(72) Inventor: Siding He, Guangdong (CN)

(73) Assignee: SHENZHEN FENGGONG CULTURE COMMUNICATION CO., LTD., Shenzhen (CN)

( * ) Notice: Subject to any disclaimer, the term of this patent is extended or adjusted under 35 U.S.C. 154(b) by 68 days.

(21) Appl. No.: 16/243,071

(22) Filed: Jan. 8, 2019

(65) Prior Publication Data
US 2019/0323697 A1 Oct. 24, 2019

(30) Foreign Application Priority Data
Apr. 19, 2018 (CN) .......................... 201810353087.9

(51) Int. Cl.
*F21V 29/70* (2015.01)
*F21K 9/66* (2016.01)
(Continued)

(52) U.S. Cl.
CPC ................. *F21V 29/70* (2015.01); *C09J 1/00* (2013.01); *C09J 11/04* (2013.01); *C09K 11/02* (2013.01);
(Continued)

(58) Field of Classification Search
CPC ....................................................... F21K 9/232
See application file for complete search history.

(56) References Cited

U.S. PATENT DOCUMENTS 7,338,704 B2 * 3/2008 Decker .................. C09K 11/06
428/323
2005/0254264 A1 * 11/2005 Sidwell ................... F21S 43/14
362/655
(Continued)

FOREIGN PATENT DOCUMENTS

CN 106090663 A 11/2016
CN 106543942 A 3/2017
(Continued)

OTHER PUBLICATIONS

Tao Ge et al., Production of functional plastics masterbatch, Jun. 2006, pp. 8-11, China Light Industry Press.
(Continued)

*Primary Examiner* — Andrew J Coughlin

(57) ABSTRACT

Disclosed is a fluorescent glue for an LED lighting bar, and an LED bulb lamp, the fluorescent glue comprises a phosphor, a heat radiation material having a refractive index larger than 1.4 and a heat emissivity larger than 0.8, and a colloid, the heat radiation material accounts for 0.5% to 10% by weight of the fluorescent glue, the phosphor accounts for 25% to 45% by weight of the fluorescent glue, and the colloid accounts for 45% to 74.5% by weight of the fluorescent glue. The fluorescent glue combined with the heat radiation material can directly convert heat generated by an LED chip and the fluorescent glue into infrared waves that are radiated into the surrounding environment, without additionally providing a heat dissipating device or spraying a heat dissipating coating.

8 Claims, 11 Drawing Sheets

(51) Int. Cl.
    *F21K 9/232*     (2016.01)
    *C09J 1/00*     (2006.01)
    *C09J 11/04*     (2006.01)
    *C09K 11/02*     (2006.01)
    *C09K 11/77*     (2006.01)
    *H01L 25/075*     (2006.01)
    *H01L 33/50*     (2010.01)
    *H01L 33/56*     (2010.01)
    *H01L 33/64*     (2010.01)
    *F21Y 115/10*     (2016.01)

(52) U.S. Cl.
    CPC .......... *C09K 11/7706* (2013.01); *F21K 9/232* (2016.08); *F21K 9/66* (2016.08); *H01L 25/0753* (2013.01); *H01L 33/502* (2013.01); *H01L 33/56* (2013.01); *H01L 33/641* (2013.01); *F21Y 2115/10* (2016.08); *H01L 2933/0091* (2013.01)

(56) References Cited

U.S. PATENT DOCUMENTS

| | | | |
|---|---|---|---|
| 2013/0050979 A1* | 2/2013 | Van de Ven | F21K 9/64 362/84 |
| 2013/0320393 A1* | 12/2013 | Moon | C08G 59/3245 257/100 |
| 2015/0076544 A1* | 3/2015 | Schmidtke | H01L 33/58 257/98 |
| 2017/0130906 A1* | 5/2017 | Jiang | H01L 33/62 |

FOREIGN PATENT DOCUMENTS

| | | |
|---|---|---|
| CN | 206958642 U | 2/2018 |
| EP | 2752898 A1 | 7/2014 |
| JP | 2014145012 A | 8/2014 |
| JP | 2017092258 A | 5/2017 |

OTHER PUBLICATIONS

Yuncai Du, Organic Chemistry, Dec. 2015, pp. 4-12, Wuhan University Press.

Search Report of counterpart European Patent Application No. 19150432.3 dated Jul. 23, 2019.

* cited by examiner

FLUORESCENT GLUE FOR LED LIGHTING BAR AND LED BULB LAMP USING THE LED LIGHTING BAR

CROSS REFERENCE TO RELATED APPLICATION

This application claims the benefit of Chinese Patent Application No. 201810353087.9 filed on Apr. 19, 2018, the contents of which are incorporated by reference herein in their entirety for all purposes.

TECHNICAL FIELD

The present invention relates to the technical field of lighting, and more particularly relates to a fluorescent glue for an LED lighting bar and an LED bulb lamp using the LED lighting bar.

BACKGROUND ART

At the end of the 20$^{th}$ century, III-V compound semiconductor materials made breakthroughs in the field of blue-light chips, which led to tremendous development of the solid state lighting (SSL) industry and promoted the transformation of the lighting industry. A semiconductor lighting technology is marked by a high-power light emitting diode (LED). Compared with the traditional lighting source, LED has the advantages of small size, light weight, fast response, low power consumption, high luminous efficiency, long service life, environmental protection, safety and reliability, etc. It is widely regarded as the main development direction of a future lighting technology, and has huge economic and social benefits.

Early LEDs only emitted monochromatic light and did not directly meet the usual white lighting requirements. In the mid-1990s of the 20$^{th}$ century, Nakamura et al. of Japan Nichia Corporation broke through the key technologies of blue LEDs and developed the technology of white LED light sources. At present, there are two main technologies for obtaining white LEDs: one is that a phosphor is excited by short-wavelength light emitted from LEDs to emit long-wavelength light, and the two beams of light are mixed to form white light; the other is that a plurality of LED chips are used to emit light of different colors to be mixed into white light. LED products produced by the multi-chip synthesis method have advantages in lumen efficiency, color rendering, color control, etc. However, the driving voltages of different chips are different. For example, the driving voltage of blue-green LEDs is generally 3-3.5 V, while the driving voltage of red LEDs is generally 2 to 2.5 V, so that the driving control is complicated, resulting in high product cost and low reliability. In contrast, a single-chip phosphor excitation technology is relatively simple in process and low in cost, and thus has become the leading choice for commercial LEDs.

For leading phosphor-converted LEDs, there are two sources of light emitting: LED chips and phosphors. Similarly, the influence of temperature on LED performance is mainly reflected in two aspects: one aspect is the temperature of an internal p-n junction of an LED chip, i.e., the influence of the so-called junction temperature on LED performance, wherein the electro-optic conversion efficiency of an LED is generally between 20% and 30%, and the rest of electrical energy is converted into heat; the other aspect is the influence of phosphor temperature on LED performance.

As a light-and-heat emitting device, temperature has a great influence on the LED performance. The increase in junction temperature will cause the decrease of the electron-hole recombination probability in a p-n junction, affecting the internal quantum efficiency of a chip, so that the brightness of the chip drops significantly after a period of operation. When the junction temperature of a white LED rises, its light decay is significantly accelerated. A higher LED junction temperature will also accelerate the degradation of a packaging material, making its optical, mechanical, thermal and other properties weakened, such as yellowing of an organic silica gel, and cracking and delamination at a packaging interface, which makes the reliability of LED products reduced and the life shortened. When the LED junction temperature rises, its service life is significantly shortened. In addition, the rise in junction temperature causes the LED light emitting peak to shift, affecting the correlated color temperature of light, and resulting in unstable light color.

In addition to the LED junction temperature, the temperature of the phosphor also affects the LED performance. When the temperature of the phosphor rises, the conversion efficiency is lowered, and the luminous flux of the phosphor is reduced. This phenomenon is called the thermal quenching phenomenon of the phosphor. The luminous intensity of the phosphor decreases significantly with the increase of the temperature. The reduction in phosphor luminescence will result in, on the one hand, a decrease in the overall lumen efficiency of LED packaging, and on the other hand, a change in the correlated color temperature of the LED mixed light. In addition, the rise in the temperature of the phosphor also causes the light emitting peak wavelength to shift, which also causes a change in the color of the mixed light.

It can be seen that the heat dissipation problem has become a major problem that restricts the development of LEDs. In the field of LEDs, in order to solve the heat dissipation problem, various kinds of heat dissipation solutions have been brought up. It comes down to the three heat dissipation principles of conduction, convection or radiation.

In terms of heat conduction, many LEDs in the prior art use metal heat sinks with heat sink fins, and there has been a lot of researches and patents on the material and shape of such heat sinks and how to increase the convective heat exchange with air. Such metal heat sinks are mainly made of aluminum alloy, which are heavy and costly, and have become one of the key factors for the high cost of the existing LEDs. In terms of heat dissipation through convection, for the existing LEDs in the field of LED bulb lamps, an LED bulb lamp is generally filled with a high thermal-conductive gas, and heat is dissipated from the bulb shell by the convection of the gas in the bulb shell. However, the heat dissipation effect of this heat dissipation is not obvious in fact.

In order to solve the heat dissipation problem, some people use heat radiation to dissipate heat. By spraying a radiation paint on the surface of a lamp, the radiance is improved, thereby removing heat to achieve heat dissipation. But when the radiation paint is sprayed on the surface of the lamp, the heat must be first transmitted to the surface of the lamp and then can be further radiated, and the actual heat dissipation effect is not obvious.

On Nov. 9, 2016, the applicant filed a Chinese patent application, whose publication No. is CN106090663A with the title "a power-supply built-in LED filament lamp with a heat radiation material". By arranging a heat radiation material layer on the back of an LED filament, heat is quickly conducted to a heat radiation material layer on the back of the substrate through a metal substrate, and then is dissipated by means of heat radiation. However, coating the heat radiation material layer on the back of the LED filament means that the LED filament cannot emit light on one side, that is, the application is only limited to a 2π light-emitting (180-degree light-emitting) LED filament instead of a 4π light-emitting (360-degree light-emitting) filament, and the luminous angle and luminous efficiency thereof are limited to a certain degree.

In addition, the applicant's previously applied patents only selected several materials with higher heat emissivity, did not further refine specific components of heat radiation materials, and did not further explore the principle of heat radiation heat dissipation.

The radiation heat dissipation may be understood as the way in which an infrared ray is emitted from the surface of a higher-temperature object and is received by a lower-temperature object. As we all know, the space outside the atmosphere is close to absolute zero, and the temperature in the upper atmosphere is also quite low. This is also a natural huge cold storage. The huge capacity of the space makes it a "black hole" for heat. If discharging the unwanted heat on the pulverized into the space in the form of electromagnetic waves, the purpose of cooling can be achieved. Radiation cooling is such a non-consumption manner of cooling.

The researchers analyze the spectral transmission characteristics of the Earth's atmosphere, and the transmission spectrum is shown in FIG. 1. It can be seen from FIG. 1 that the atmosphere has different transmittances for different wavelengths of radiation. In an interval where the transmittance is high, the electromagnetic waves in the wavelength band can penetrate through the atmosphere more freely, and these intervals are meteorologically referred to as the "window" of the atmosphere. The spectral transmission characteristics of the atmosphere are mainly determined by water vapor, carbon dioxide and ozone in the atmosphere. The change in their content causes a change in transmittance, but the distribution of the transmission spectrum does not change much. Among several atmospheric windows, the band of 8 to 13 μm is more notable because the wavelength of blackbody radiation at normal temperature is mainly concentrated in this band. The atmosphere is permeable to electromagnetic radiation in this band. So, if there is a material that converts heat into electromagnetic waves in this particular band, heat waste can leave the earth. As a heat-dissipating manner that does not consume energy, it will have broad application prospects in the field of LEDs.

In summary, in order to further develop LEDs, the prior art has yet to be further improved and developed.

SUMMARY OF THE INVENTION

The present invention is directed to solving at least one aspect of the above problems and deficiencies that exist in the prior art. Accordingly, the present invention is directed to provide a fluorescent glue for an LED lighting bar and an LED bulb lamp using the lighting bar, which have an excellent heat dissipation effect and high luminous efficiency.

In order to solve the above problems, the technical solution of the present invention is as follows:

A fluorescent glue for an LED lighting bar comprises a phosphor, a heat radiation material having a refractive index larger than 1.4 and a heat emissivity larger than 0.8, and a colloid; the heat radiation material accounts for 0.5% to 10% by weight of the fluorescent glue, the phosphor accounts for 25% to 45% by weight of the fluorescent glue, and the colloid accounts for 45% to 74.5% by weight of the fluorescent glue.

According to the fluorescent glue for an LED lighting bar, the heat radiation material having a refractive index larger than 1.4 and a heat radiation rate larger than 0.8 may be selected from one or more of mica powder, boron nitride, aluminum oxide, silicon oxide or calcium fluoride.

According to the fluorescent glue for an LED lighting bar, the heat radiation material having a refractive index larger than 1.4 and a heat emissivity larger than 0.8 may be formed by covalently bonding mica powder with one or more of boron nitride, aluminum oxide, silicon oxide or calcium fluoride.

According to the fluorescent glue for an LED lighting bar, the phosphor may be any combination of YAG-series yellow powder, YAG-series yellow green powder, or silicate-series yellow powder, silicate-series yellow green powder, silicate-series orange powder, or nitride-series red powder, nitrogen oxide-series red powder, or YAG-series phosphors, silicate-series phosphors, nitride-series phosphors, and oxynitride-series phosphors; and the phosphor has a particle size of 5 to 20 μm.

According to the fluorescent glue for an LED lighting bar, the colloid may be selected from one or more of an organic silica gel, an epoxy resin, a modified epoxy resin, a plastic, a transparent glue, a transparent paint and a polymer.

According to the fluorescent glue for an LED lighting bar, the colloid may be a methyl-based organic silica gel or a phenyl-based organic silica gel.

The fluorescent glue for an LED lighting bar may further comprise at least one additive of a dispersing agent, an assistant dispersing agent, a coupling agent, and an anti-sludging agent.

An LED bulb lamp comprises a sealed light-transmissive bulb shell, an LED lighting bar located in the light-transmissive bulb shell, and a high thermal-conductive gaseous medium located inside the light-transmissive bulb shell; a light-emitting surface of the LED lighting bar may be provided with the fluorescent glue for an LED lighting bar as described above, and the high thermal-conductive gaseous medium may be helium gas, or hydrogen gas, or a mixed gas of helium gas and hydrogen gas.

According to the LED bulb lamp, the light-transmissive bulb shell may be a silicate-based glass bulb shell having an infrared transmittance larger than 0.8.

The LED bulb lamp may be an A-type bulb lamp, a G-type bulb lamp, a PAR-type bulb lamp, a T-type bulb lamp, a C-type bulb lamp, a P-type bulb lamp, a PS-type bulb lamp, a BR-type bulb lamp, an ER-type bulb lamp, a BRL-type bulb lamp or a street lamp.

Advantageous effects of the present invention include:

The disclosure of the present invention is good in heat dissipation effect. According to the fluorescent glue for an LED lighting bar and the LED bulb lamp provided by the present invention, the fluorescent glue combined with the heat radiation material can directly convert heat generated by an LED chip and the fluorescent glue into infrared waves of 2 to 20 μm, which are radiated into the surrounding environment, without additionally providing a heat dissipating device or spraying a heat dissipating coating. Further, after the light-emitting surface of the LED lighting bar is coated with the fluorescent glue provided by the present invention, heat is directly dissipated by the fluorescent glue. It is unnecessary to provide a heat dissipation layer on the back of a substrate to realize 4π light emitting, and the heat dissipation performance is good, which not only solves the problem of poor heat dissipation performance of the existing 4π light-emitting LED lighting bar, but also solves the problem that the existing 2π light-emitting LED lighting bar can only emit light at 180 degrees.

Furthermore, the LED bulb lamp provided by the present invention is provided with a fluorescent glue for an LED lighting bar as described above on the light-emitting surface of the built-in LED lighting bar. On the one hand, heat can be converted into an infrared wave of 2 to 20 μm first, and then transmitted to the surrounding environment through a silicate-based glass bulb shell having an infrared transmittance larger than 0.8. On the other hand, the heat can also be conducted to the glass bulb shell by gas convection through a high thermal-conductive gas medium in the bulb shell, so as to be conducted into the surrounding environment, thereby achieving heat dissipation in multiple directions.

The disclosure of the present invention has high luminous efficiency. The heat radiation material in the fluorescent glue described in the present invention has a high refractive index and a small particle size, and does not affect the light emission of LEDs. Further, the heat radiation material can form a scattering particle layer, so as to enhance the heat dissipation intensity of blue light, so that the blue light is re-reflected as much as possible and excites the complementary color particles of the blue light to emit light, thereby increasing the luminous efficiency.

Figure 1:
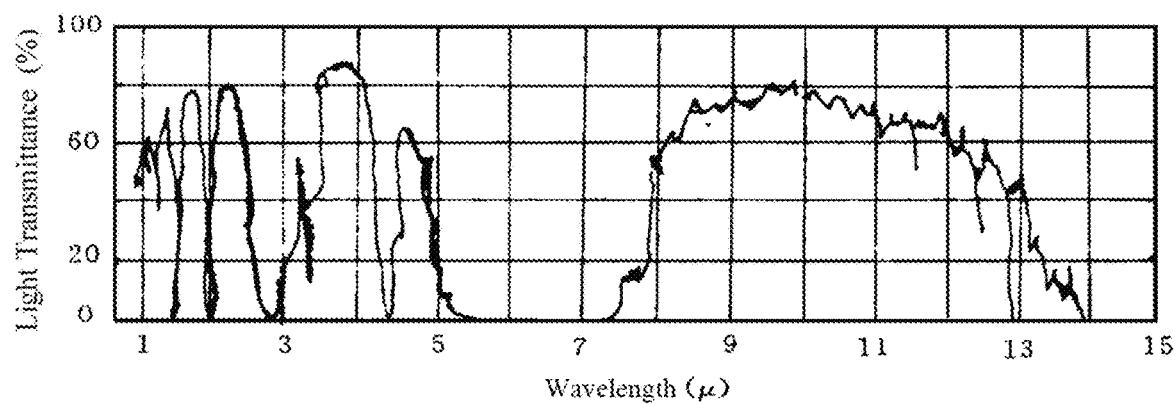
FIG. 1 is a transmission spectrum diagram of the atmosphere.

DESCRIPTION OF THE DRAWING REFERENCE SIGNS 1, first LED lighting bar; 2, second LED lighting bar; 3, third LED lighting bar; 4, fourth LED lighting bar; 5, fifth LED lighting bar; 6, sixth LED lighting bar; 7, seventh LED lighting bar; 8, eighth LED lighting bar; 101, metal substrate; 102, LED chip; 103, first fluorescent glue; 203, second fluorescent glue; 303, third fluorescent glue; 403, fourth fluorescent glue; 301, transparent substrate; 901, light-transmissive bulb shell; 10, core column; 11, metal wire; 12, electrical connection wire; 13, exhaust pipe; 14, vacuum sealed cavity; 15, lamp cap; 16, drive power supply; 17, transparent ceramic tube; 18, LED flip chip.

DETAILED DESCRIPTION OF THE INVENTION

Implementations of the present invention are described in detail below, and the examples of the implementations are illustrated in the drawings, where the same or similar reference numerals throughout indicate the same or similar elements or elements having the same or similar functions. The implementations described below with reference to the drawings are exemplary, only intended to be illustrative of the present invention and not to be construed as limiting to the present invention.

In the description of the present invention, it should be understood that orientation or position relationships indicated by the terms such as "center", "longitudinal", "transverse", "length", "width", "thickness", "up", "down", "front", "rear", "left", "right", "vertical", "horizontal", "top", "bottom", "inside", and "outside" are based on orientation or position relationships shown in the accompanying drawings, and are used only for ease and brevity of illustration and description of the present invention, rather than indicating or implying that the mentioned device or component must have a particular orientation or must be constructed and operated in a particular orientation. Therefore, such terms should not be construed as limiting to the present invention. In the description of the present invention, it should be noted that unless otherwise explicitly specified or defined, the terms such as "mount", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. A person of ordinary skill in the art may understand the specific meanings of the foregoing terms in the present invention according to specific situations.

In the present invention, unless otherwise explicitly specified or defined, the expression that a first feature is "on" or "beneath" a second feature may include that the first and second features are in direct contact, and may also include that the first and second features are not in direct contact but contact through additional features therebetween. Moreover, the expression that the first feature is "above" and "over" the second feature includes that the first feature is right above and diagonally above the second feature, or merely indicates that the first feature level is higher than the second feature. Moreover, the expression that the first feature is "below" and "under" the second feature includes that the first feature is right below and diagonally below the second feature, or merely indicates that the first feature level is lower than the second feature.

The following disclosure provides many different implementations or examples for implementing different structures of the present invention. In order to simplify the disclosure of the present invention, the components and arrangements of specific examples are described below. Of course, they are merely examples and are not intended to limit the present invention. In addition, the present invention may repeat reference numbers and/or reference letters in various examples, which are for the purpose of simplicity and clarity, and do not indicate a relationship between various implementations and/or arrangements discussed. In addition, the present invention provides examples of various specific processes and materials, but a person of ordinary skill in the art will recognize the application of other processes and/or the use of other materials.

The present invention provides a fluorescent glue for an LED lighting bar. The fluorescent glue comprises a phosphor, a heat radiation material having a refractive index larger than 1.4 and a heat emissivity larger than 0.8, and a colloid. The heat radiation material accounts for 0.5% to 10% by weight of the fluorescent glue, the phosphor accounts for 25% to 45% by weight of the fluorescent glue, and the colloid accounts for 45% to 74.5% by weight of the fluorescent glue. The fluorescent glue combined with the heat radiation material can directly convert heat generated by an LED chip and the fluorescent glue into infrared waves of 2 to 20 μm, which are radiated into the surrounding environment, without additionally providing a heat dissipating device or spraying a heat dissipating coating. Further, after the light-emitting surface of the LED lighting bar is coated with the fluorescent glue provided by the present invention, heat is directly dissipated by the fluorescent glue. It is unnecessary to provide a heat dissipation layer on the back of a substrate and 4π light emitting is realized, and the heat dissipation performance is good, which not only solves the problem of poor heat dissipation performance of the existing 4π light-emitting LED lighting bar, but also solves the problem that the existing 2π light-emitting LED lighting bar can only emit light at 180 degrees.

In the process of using existing LEDs, the loss of photons generated during outward emission mainly includes three aspects: (1), defects of an internal structure of a chip and absorption of materials; (2), reflection losses caused by photons at an exit interface due to a refractive index difference; (3), total reflection losses caused by the fact that an angle of incidence is larger than a critical angle of total reflection. Therefore, a lot of light cannot be emitted from the chip to the outside. The prior art generally coats the surface of a chip with a silica gel having a relatively high refractive index between the chip and air, so as to effectively reduce the loss of photons at the interface, and improve the light extraction efficiency. This layer of silica gel is usually combined with a phosphor layer. The heat radiation material provided by the present invention has a refractive index larger than 1.4, and can also play the same role as the silica gel, effectively reducing the loss of photons at the interface, thereby improving the light extraction efficiency. Besides, a scattering particle layer can also be formed, so as to enhance the heat dissipation intensity of light, so that the light is re-reflected as much as possible and excites complementary color particles of the light to emit light, thereby increasing the luminous efficiency.

The present invention selects a heat radiation material having a refractive index larger than 1.4 and a heat emissivity larger than 0.8, which not only can achieve the effect of radiation heat dissipation, but also has a higher refractive index, thereby avoiding the influence on the luminous effect of the LED lighting bar. Preferably, the heat radiation material may be selected from a heat radiation material known to exhibit excellent heat radiation properties, light transmission properties, etc., such as one or more of mica powder, boron nitride, aluminum oxide, silicon oxide or calcium fluoride.

Further, the heat radiation material may be formed by covalently bonding mica powder with one or more of boron nitride, aluminum oxide, silicon oxide or calcium fluoride. The mica powder bonded with other heat radiation materials has a more stable structure, and the mica powder can also be used as a good dispersing agent and coupling agent to uniformly disperse the heat radiation material and the phosphor into the colloid.

Figure 2:
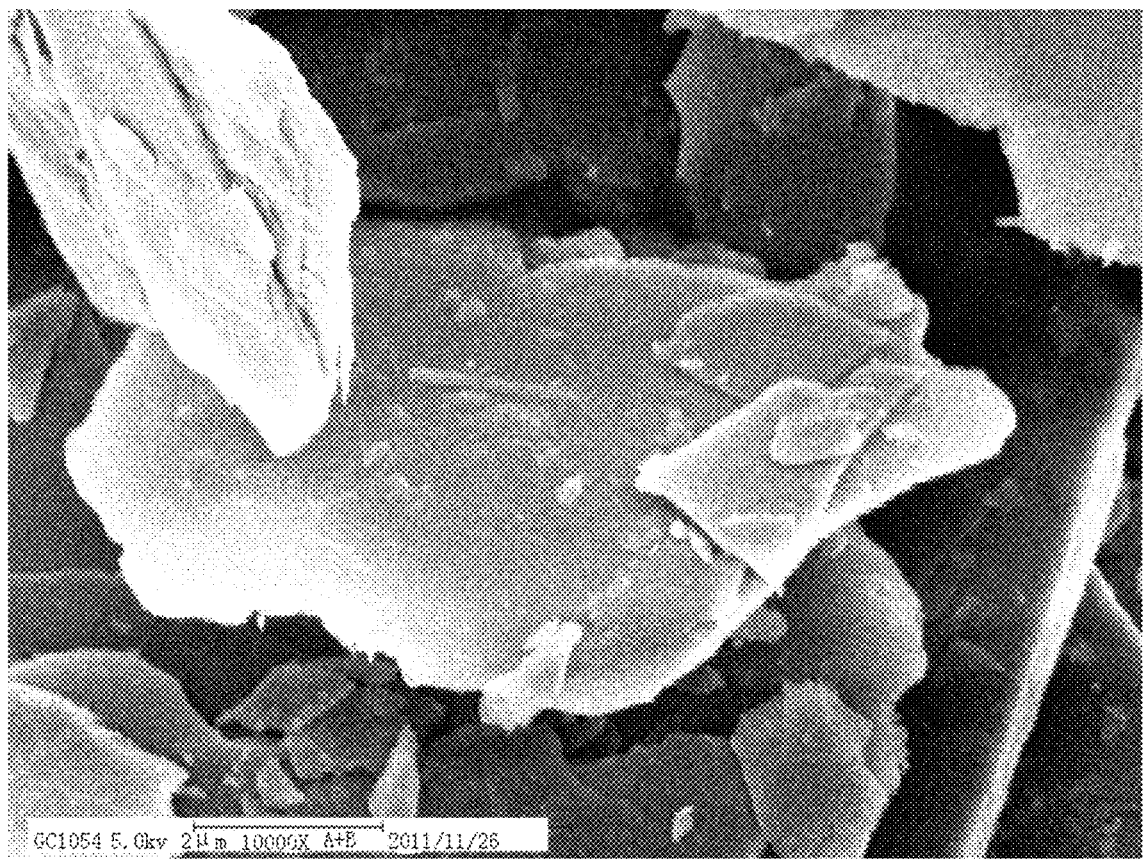
FIG. 2 is a photomicrograph of mica powder provided by the present invention.
Figure 3:
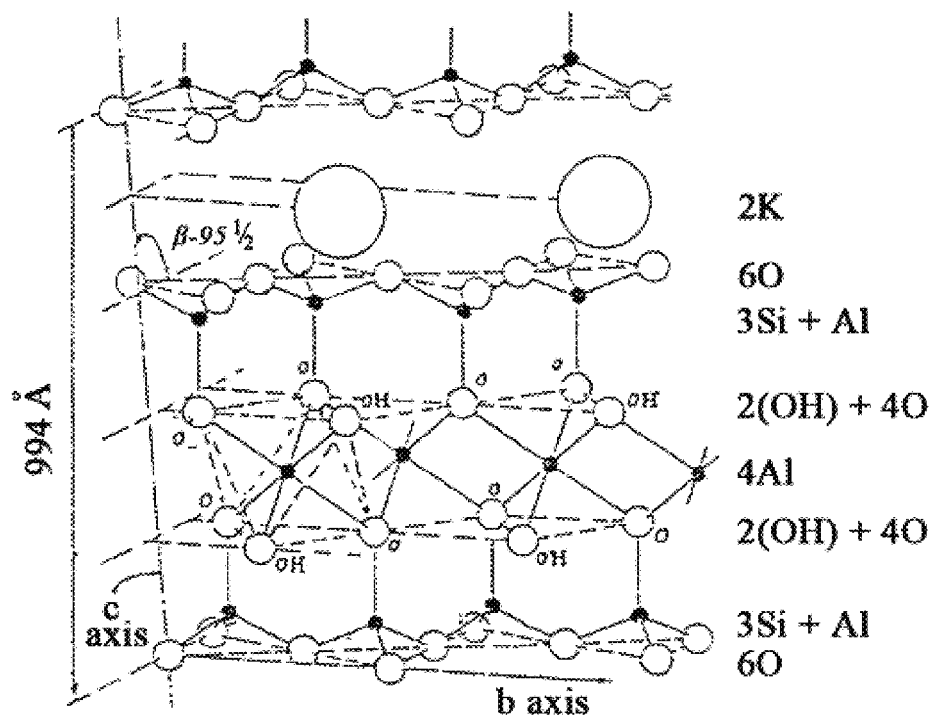
FIG. 3 is a chemical structure diagram of mica powder provided by the present invention.
Figure 4:
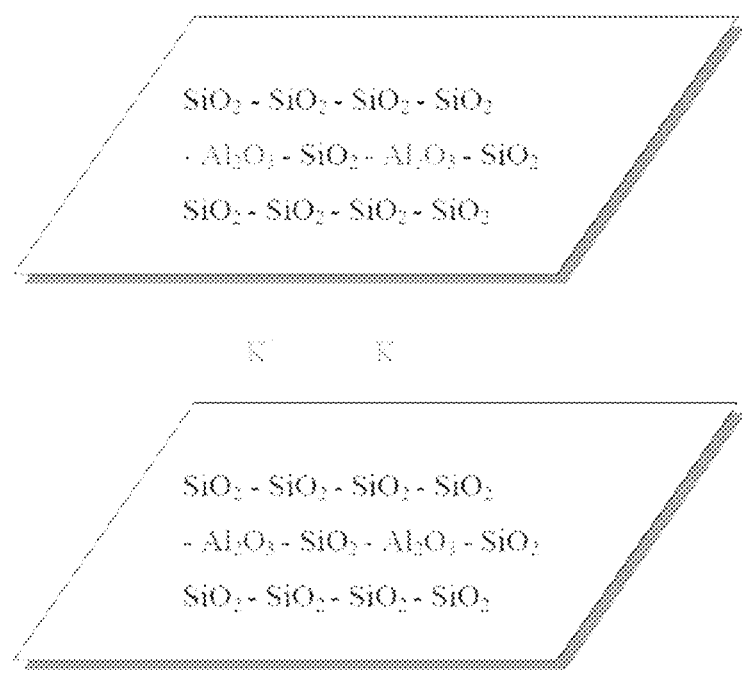
FIG. 4 is a molecular structure diagram of mica powder provided by the present invention.
Figure 5:
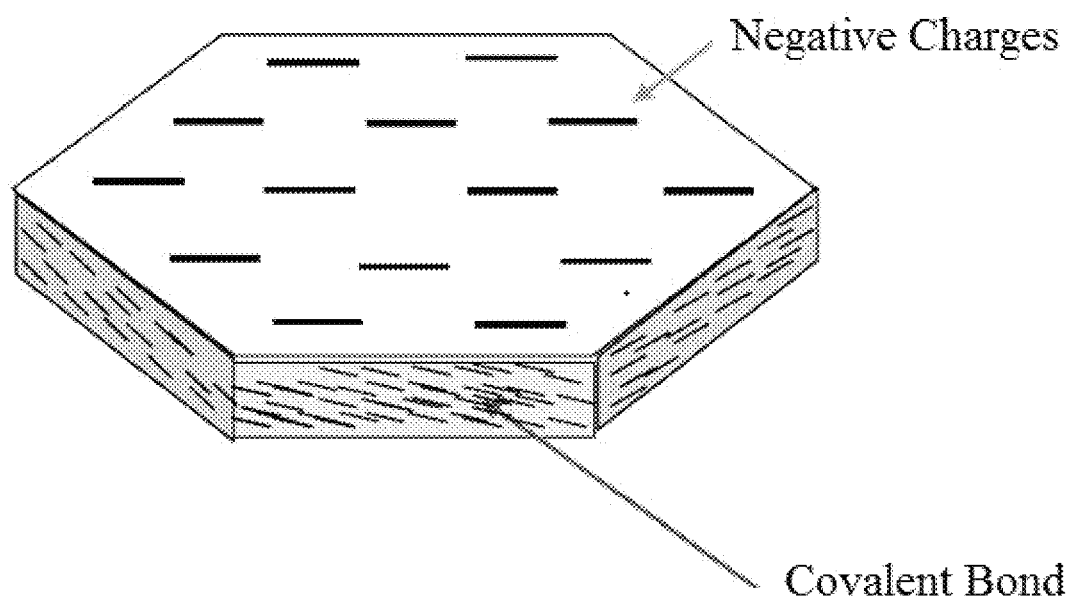
FIG. 5 is a functional structure diagram of mica powder provided by the present invention.

FIG. 2 is a photomicrograph of mica magnified 10,000 times under a microscope. It can be seen from the figure that the mica is of a laminar structure having a thin thickness, a large diameter-to-thickness ratio and a large specific surface area. As the specific surface area is larger, the radiation performance is better. As shown in FIG. 3, it is a crystal structure diagram of mica. In combination with a molecular structure diagram of mica shown in FIG. 4 and a functional diagram of mica shown in FIG. 5, the mica is SiO2 and Al2O3 covalently bonded in a plane direction, with negative charges distributed on the surface and one layer bonded to another layer by K+ or the like. Based on the special structural properties of mica, the mica can be covalently bonded with other heat radiation materials, to realize a more stable structure. Moreover, the mica powder can act as a dispersing agent, so that the heat radiation material can be more uniformly combined with the colloid.

Preferably, the mica powder is any one of white mica powder (muscovite), sericite powder, Nano-mica powder or modified mica powder.

Further, in order to avoid interference with the light-emitting surface of the LED lighting bar, the heat radiation material may have a particle size of 200 nm to 100 μm.

Preferably, the phosphor may be any combination of YAG-series yellow powder, YAG-series yellow green powder, or silicate-series yellow powder, silicate-series yellow green powder, silicate-series orange powder, or nitride-series red powder, nitrogen oxide-series red powder, or YAG-series phosphors, silicate-series phosphors, nitride-series phosphors, and oxynitride-series phosphors, and the phosphor has a particle size of 5 to 20 μm.

In practical applications, the colloid is selected from one or more of an organic silica gel, an epoxy resin, a modified epoxy resin, a plastic, a transparent glue, a transparent paint and a polymer.

Preferably, the colloid is a methyl-based organic silica gel or a phenyl-based organic silica gel. An ambient temperature of about 250° C. is applicable when the methyl-based organic silica gel is selected, and an ambient temperature of about 200° C. is applicable when the phenyl-based organic silica gel is selected.

The fluorescent glue for an LED lighting bar further comprises at least one additive of a dispersing agent, an assistant dispersing agent, a coupling agent, and an anti-sludging agent, which may be an additive known in the prior art or sold for a fluorescent glue for an LED lighting bar.

As the dispersing agent in the additive, any dispersing agent suitable for the fluorescent glue for an LED lighting bar can be used, which is not particularly limited. The dispersing agent may be, for example, an acrylic dispersing agent, a styrene-based dispersing agent, a polyolefin-based dispersing agent, an acrylate-ester-based dispersing agent, a polyacetal-based dispersing agent, a polycarbonate-ester-based dispersing agent, a polyacrylate-ester-based dispersing agent, a polyamide-based dispersing agent, a polyamideimide-based dispersing agent, a polyarylsulfone-based dispersing agent, a polyetherketone-based dispersing agent, a polytriazole-based dispersing agent, a polysulfone-based dispersing agent, a polyurethane-based dispersing agent, a polyethersulfone-based dispersing agent, or the like.

Several examples are provided below to aid in the understanding of the present invention.

Embodiment 1

Raw materials: in terms of mass percentage, 5 g of sericite powder, 25 g of yellow YAG phosphor, and 70 g of methyl-based organic silica gel. The sericite powder and the yellow YAG phosphor are pulverized separately until the mica powder has a particle size of 5 μm and the yellow YAG phosphor has a particle size of 5 μm. The above components are thoroughly mixed with the methyl-based organic silica gel, and stirred under vacuum for 1 hour to obtain a target fluorescent glue.

Figure 6:
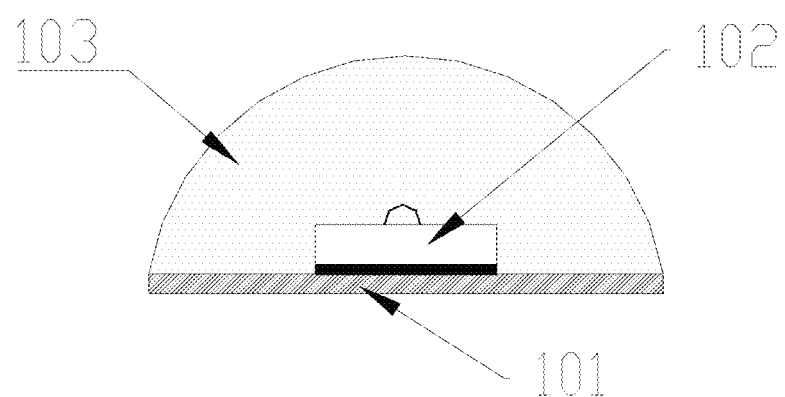
FIG. 6 is a sectional view of a first LED lighting bar 1 coated with a fluorescent glue provided by the present invention.
Figure 7:
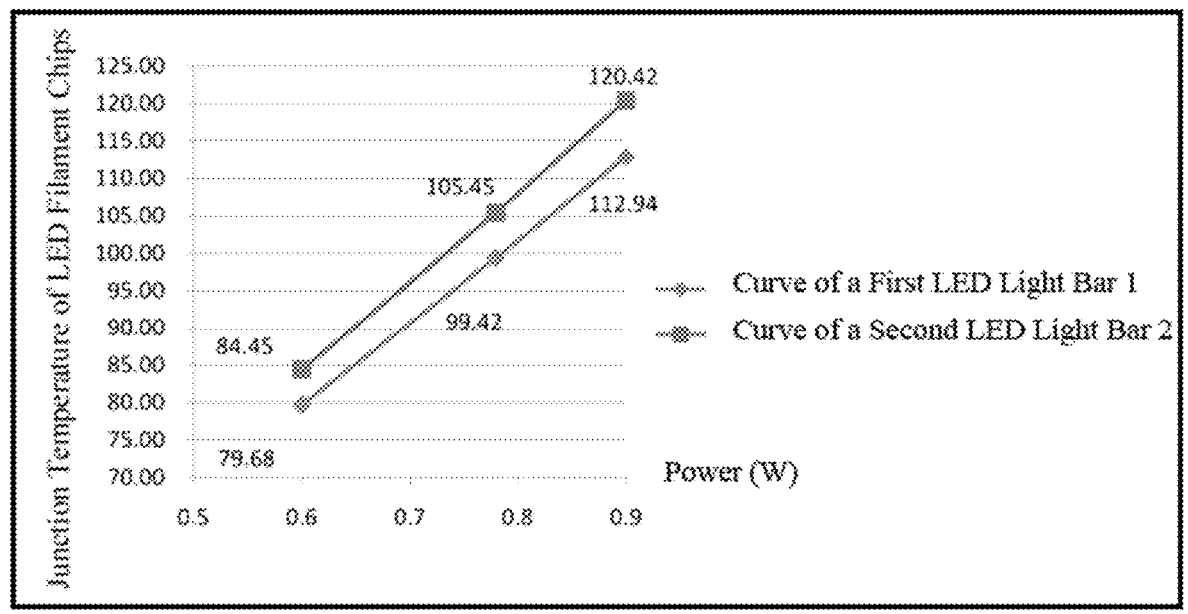
FIG. 7 is a comparison diagram of a chip junction temperature between a first LED lighting bar 1 and a second LED lighting bar 2 provided by the present invention.

As shown in FIG. 6, after the preparation, the fluorescent glue is named as a first fluorescent glue (103) coated on the light-emitting surface of a first LED lighting bar (1); the first LED lighting bar (1) comprises a metal substrate (101), a string of LED chips (102) connected in series are disposed on the metal substrate (101), and the first fluorescent glue (103) is coated on the LED chips (102). A second LED lighting bar (2) coated with the existing conventional fluorescent glue is selected, other structures of the second LED lighting bar (2) are identical to those of the first LED lighting bar (1). After the first LED lighting bar (1) and the second LED lighting bar (2) are energized respectively, the temperature changes of the two are detected for evaluation. The detection result is shown in FIG. 7.

Embodiment 2

Raw materials: in terms of mass percentage, 6 g of aluminum oxide powder, 25 g of yellow green YAG phosphor, and 69 g of methyl-based organic silica gel. The aluminum oxide powder and the yellow YAG phosphor are pulverized separately until the aluminum oxide powder has a particle size of 1 μm and the yellow YAG phosphor has a particle size of 1 μm. The above components are thoroughly mixed with the methyl-based organic silica gel, and stirred under vacuum for 1.5 hours to obtain a target fluorescent glue.

Figure 8:
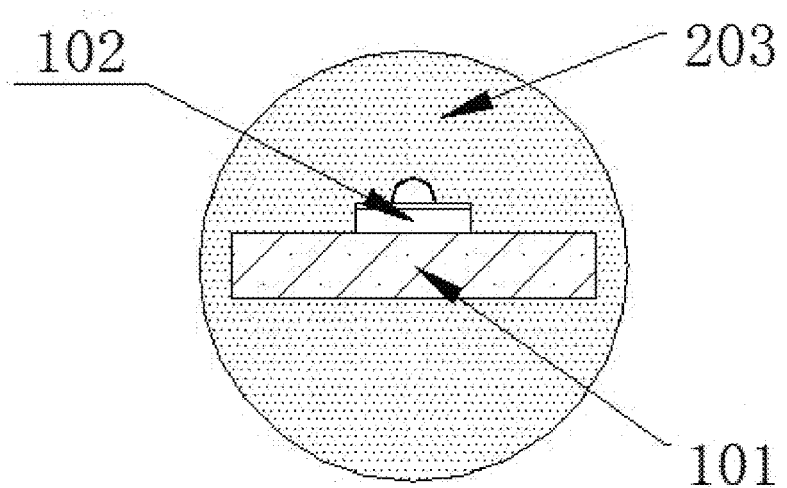
FIG. 8 is a sectional view of a third LED lighting bar 3 coated with a fluorescent glue provided by the present invention.
Figure 9:
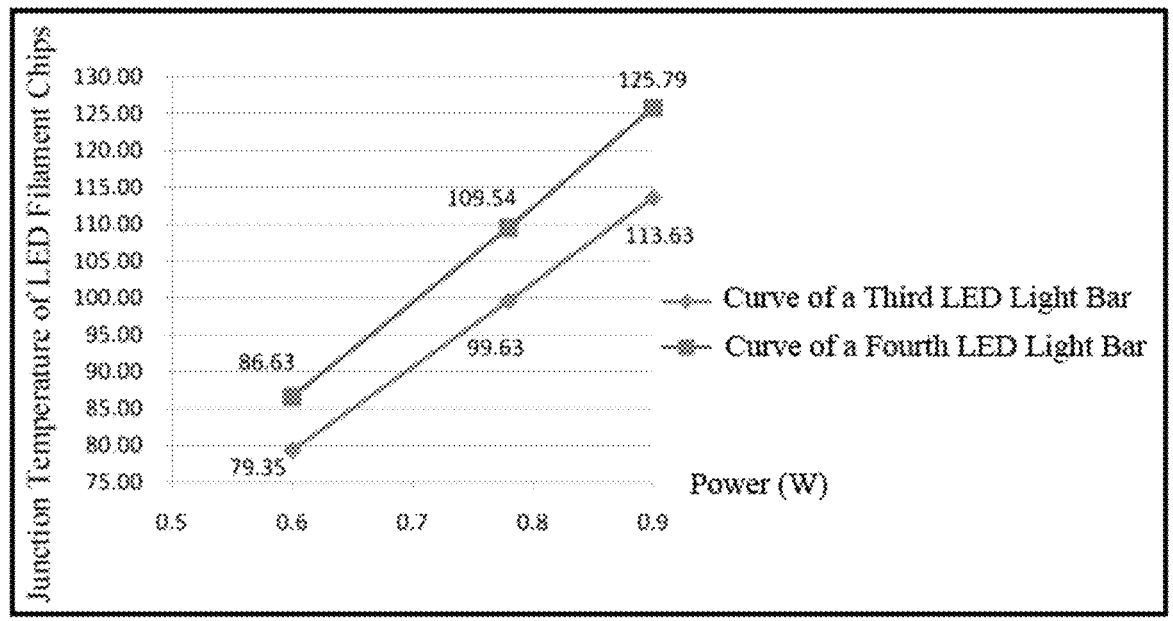
FIG. 9 is a comparison diagram of a chip junction temperature between a third LED lighting bar 3 and a fourth LED lighting bar 4 provided by the present invention.

As shown in FIG. 8, after the preparation, the fluorescent glue is named as a second fluorescent glue (203) coated on the light-emitting surface of a third LED lighting bar (3), the third LED lighting bar (3) including a transparent substrate (301); a string of LED chips (102) connected in series are disposed on the transparent substrate (301), and the second fluorescent glue (203) is coated on the light-emitting surface of the entire third LED lighting bar (3). A fourth LED lighting bar (4) coated with the existing conventional fluorescent glue is selected, and other structures of the fourth LED lighting bar (4) are identical to those of the third LED lighting bar (3). After the third LED lighting bar (3) and the fourth LED lighting bar (4) are energized respectively, the temperature changes of the two are detected for evaluation. The detection result is shown in FIG. 9.

Embodiment 3

Raw materials: in terms of mass percentage, 3 g of sericite powder, 3 g of aluminum oxide powder, 35 g of yellow YAG phosphor, and 59 g of methyl-based organic silica gel. The sericite powder, the aluminum oxide powder and the yellow YAG phosphor are pulverized separately until the sericite powder has a particle size of 300 nm, the aluminum oxide powder has a particle size of 300 nm and the yellow YAG phosphor has a particle size of 5 μm. The sericite powder and the aluminum oxide powder are mixed and sintered at a sintering temperature of 600° C., and the sintered mixed powder was thoroughly mixed with the yellow YAG phosphor and the organic silica gel, and stirred under vacuum for 2 hours to obtain a target fluorescent glue.

Figure 10:
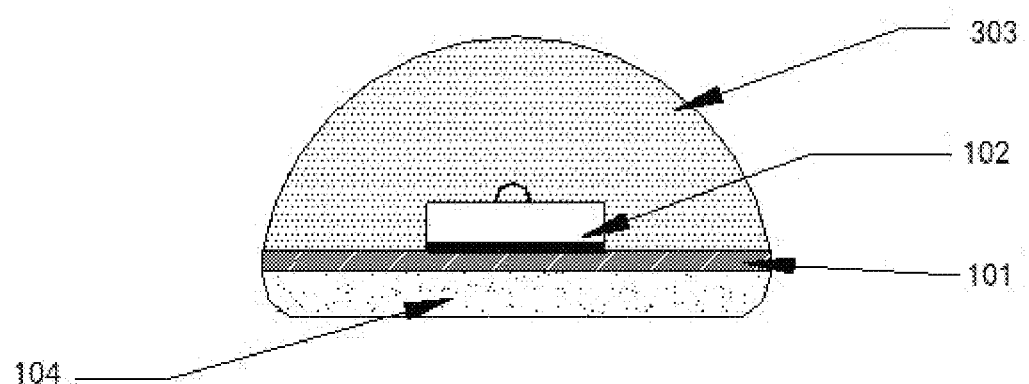
FIG. 10 is a sectional view of a fifth LED lighting bar 5 coated with a fluorescent glue provided by the present invention.
Figure 11:
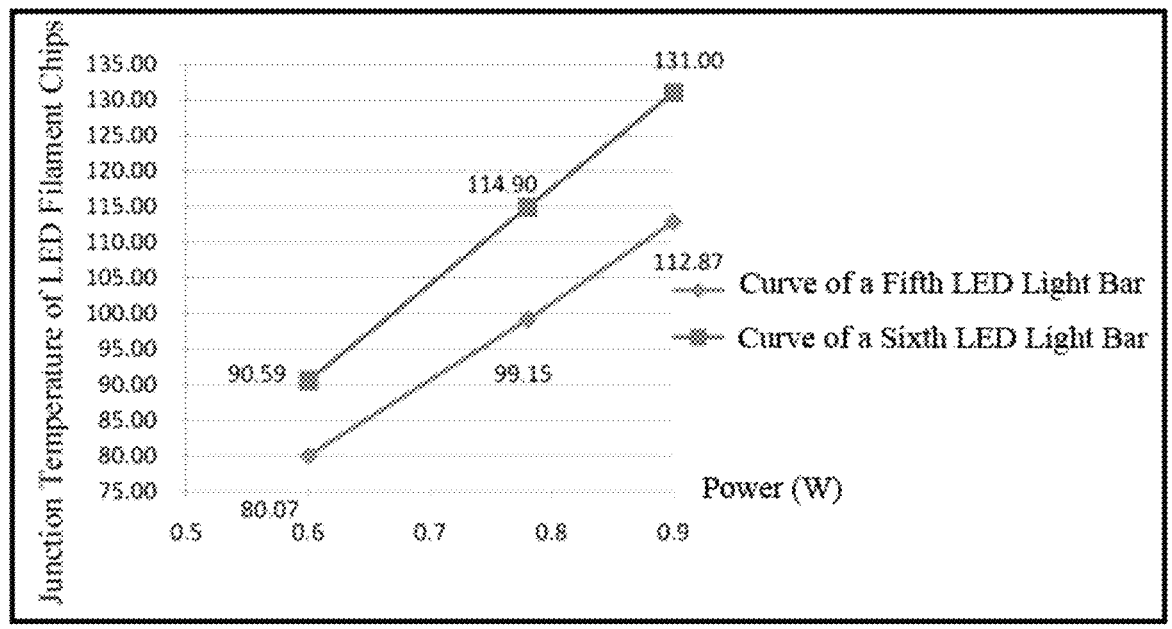
FIG. 11 is a comparison diagram of a chip junction temperature between a fifth LED lighting bar 5 and a sixth LED lighting bar 6 provided by the present invention.

As shown in FIG. 10, after the preparation, the fluorescent glue is named as a third fluorescent glue (303) coated on the light-emitting surface of a fifth LED lighting bar (5), the fifth LED lighting bar (5) including a metal substrate (101); a string of LED chips (102) connected in series are disposed on the metal substrate (101), the third fluorescent glue (303) is coated on the LED chips (102), and a heat dissipating layer (104) is also disposed on the back of the metal substrate (101); the heat dissipating layer (104) may be a heat radiation material layer. A sixth LED lighting bar (6) coated with the existing conventional fluorescent glue is selected, and other structures of the sixth LED lighting bar (6) are identical to those of the fifth LED lighting bar (5). After the fifth LED lighting bar (5) and the sixth LED lighting bar (6) are energized respectively, the temperature changes of the two are detected for evaluation. The detection result is shown in FIG. 11.

Embodiment 4

Raw materials: in terms of mass percentage, 5 g of modified mica powder, 4 g of boron nitride powder, 30 g of silicate-series phosphor, 1 g of acrylic dispersing agent, and 60 g of modified epoxy resin. The modified mica powder, the boron nitride powder and a yellow YAG phosphor are pulverized separately until the modified mica powder has a particle size of 400 nm, the boron nitride powder has a particle size of 400 nm and the silicate-series phosphor has a particle size of 10 μm. The modified mica powder and the boron nitride powder are mixed and sintered at a sintering temperature of 500° C., and the sintered mixed powder was thoroughly mixed with the silicate-series phosphor, the modified epoxy resin gel and the acrylic dispersing agent, and stirred under vacuum for 2 hours to obtain a target fluorescent glue.

Figure 12:
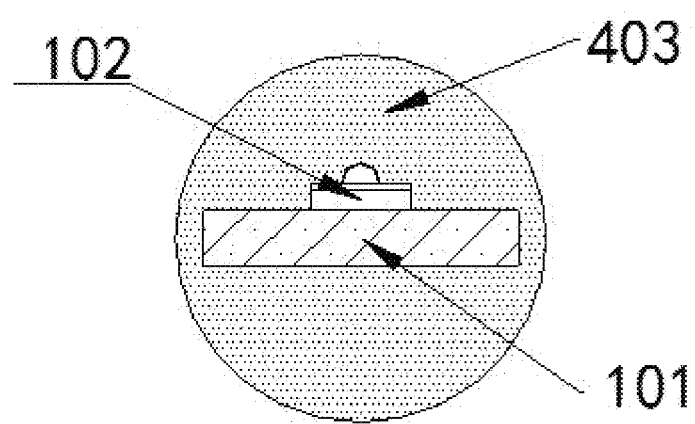
FIG. 12 is a sectional view of a seventh LED lighting bar 7 coated with a fluorescent glue provided by the present invention.

As shown in FIG. 12, after the preparation, the fluorescent glue is named as a fourth fluorescent glue (403) coated on the light-emitting surface of a seventh LED lighting bar (7); the seventh LED lighting bar (7) comprises a transparent substrate (301); a string of LED chips (102) connected in series are disposed on the transparent substrate (301), and the fourth fluorescent glue (403) is coated on the light-emitting surface of the entire seventh LED lighting bar (7).

Figure 13:
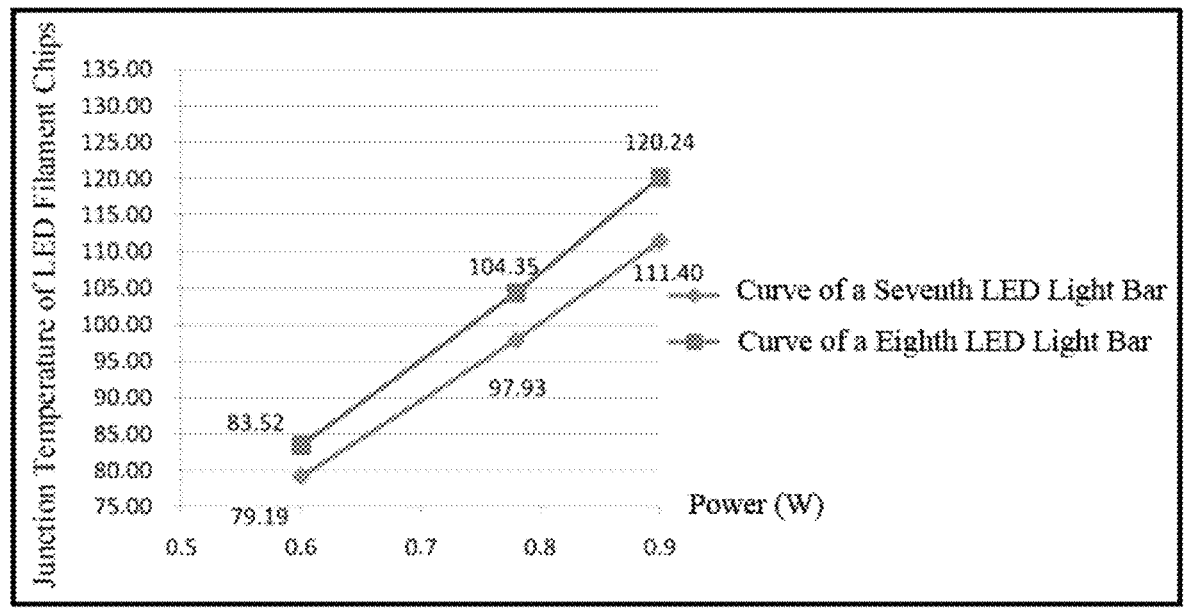
FIG. 13 is a comparison diagram of a chip junction temperature between a fifth LED lighting bar 5 and a sixth LED lighting bar 6 provided by the present invention.

An eighth LED lighting bar (8) coated with the existing conventional fluorescent glue is selected, and other structures of the eighth LED lighting bar (8) are identical to those of the seventh LED lighting bar (7). After the seventh LED lighting bar (7) and the eighth LED lighting bar (8) are energized respectively, the temperature changes of the two are detected for evaluation. The detection result is shown in FIG. 13.

Figure 14:
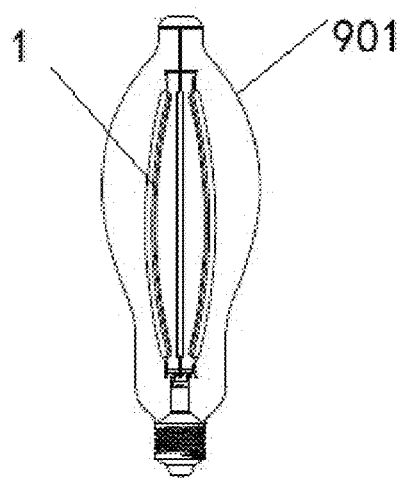
FIG. 14 is a schematic structure diagram of an LED street lamp provided by the present invention.

The present invention also provides an LED bulb lamp. As shown in FIG. 14, it shows an LED street lamp provided by the present invention. The LED street lamp comprises a sealed light-transmissive bulb shell (901), a first LED lighting bar (1) located in the light-transmissive bulb shell (901), and a high thermal-conductive gaseous medium (not shown in the figure) located inside the light-transmissive bulb shell (901); the first LED lighting bar (1) is an LED lighting bar (1) prepared in Embodiment 1 whose light-emitting surface is provided with a first fluorescent glue, and the high thermal-conductive gaseous medium is helium gas, or hydrogen gas, or a mixed gas of helium gas and hydrogen gas; and a portion of heat can be conducted to the light-transmissive bulb shell (901) through the high thermal-conductive gas, and then spread to the surrounding environment.

Preferably, the light-transmissive bulb shell (901) is a silicate-based glass bulb shell having an infrared transmittance larger than 0.8, so that the converted infrared wave can be directly spread through the light-transmissive bulb shell (901).

Figure 15:
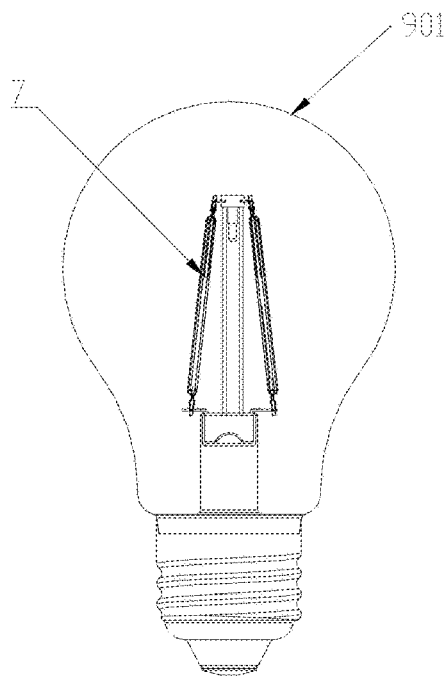
FIG. 15 is a schematic structure diagram of an A60-type LED bulb lamp provided by the present invention.
Figure 16:
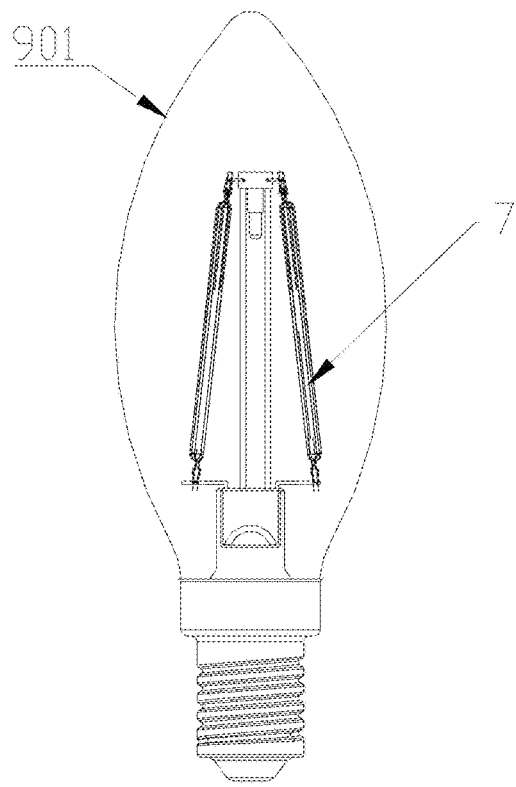
FIG. 16 is a schematic structure diagram of a C35-type LED bulb lamp provided by the present invention.

Further, the present invention does not limit the type of the LED bulb lamp. The LED bulb lamp may be an A-type bulb lamp, a G-type bulb lamp, a PAR-type bulb lamp, a T-type bulb lamp, a C-type bulb lamp, a P-type bulb lamp, a PS-type bulb lamp, a BR-type bulb lamp, an ER-type bulb lamp, a BRL-type bulb lamp or a street lamp. As shown in FIG. 15, it shows an A60-type LED bulb lamp provided by the present invention. FIG. 16 shows a C35-type LED bulb lamp provided by the present invention.

Figure 17:
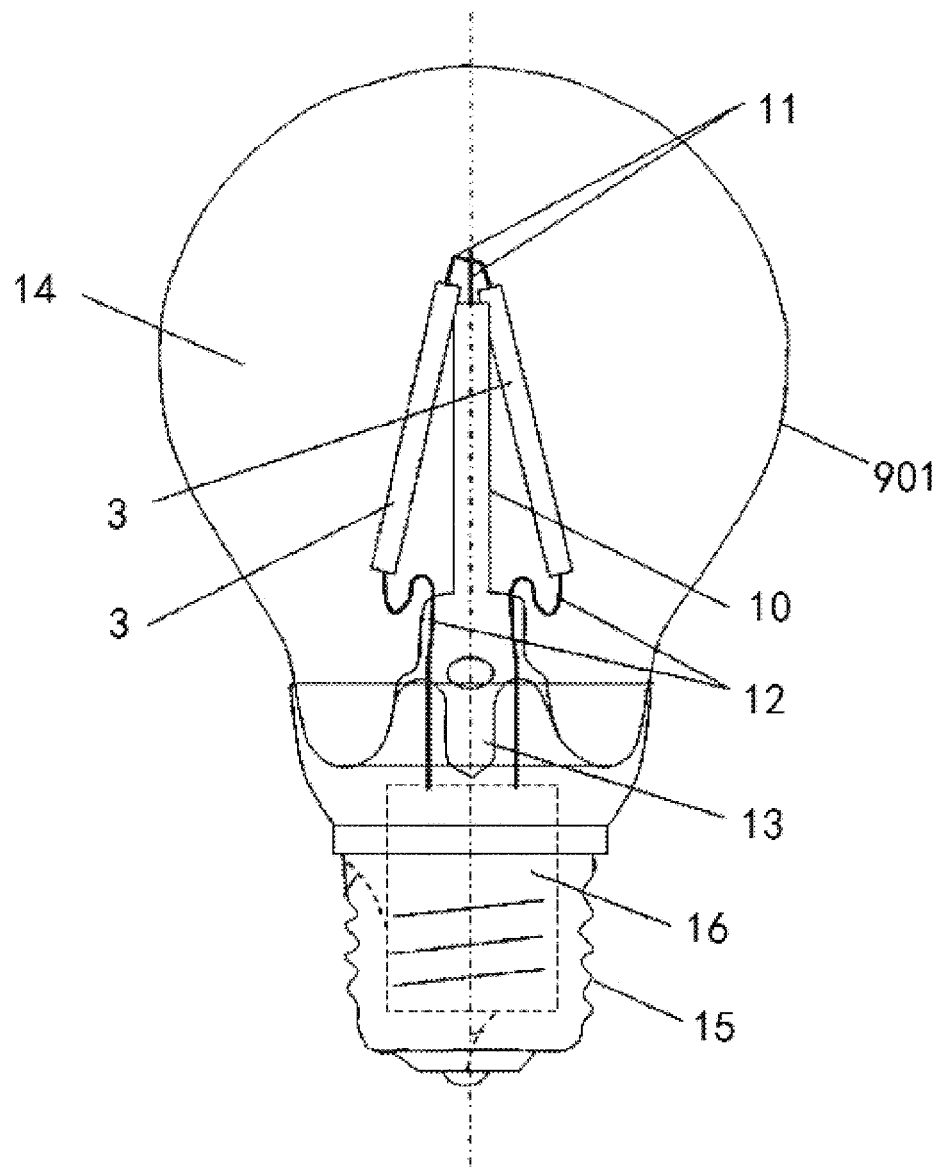
FIG. 17 is a schematic structure diagram of another 4π light-emitting LED bulb lamp provided by the present invention.

As shown in FIG. 17, the present invention also provides a 4π light-emitting LED bulb lamp, including a light-transmissive bulb shell (901), a core column (10) with an exhaust pipe (13) and a bracket, at least one 4π light-emitting third LED lighting bar (3), a drive power supply (16), and a lamp cap (15). The light-transmissive bulb shell (901), the core column (10), the third LED lighting bar (3), the drive power supply (16) and the lamp cap (15) are integrated by mutual connection. Electrodes of the third LED lighting bars (3) are sequentially connected to each other via an electrical connection wire (12) of the core column (10), the lamp cap (15) and an external power supply. When the external power supply is switched on, the third LED lighting bar (3) can be turned on. The light-transmissive bulb shell (901) and the core column (10) are vacuum-sealed to form a vacuum sealed cavity (14), and the vacuum sealed cavity (14) is filled with high thermal-conductive gas. A portion of heat generated by the third LED lighting bar (3) can be conducted to the light-transmissive bulb shell (901) through the gas and then dissipated. The other portion of the heat is converted into an infrared wave by a second fluorescent glue (203) on the third LED lighting bar (3), and is dissipated through the light-transmissive bulb shell (901).

Figure 18:
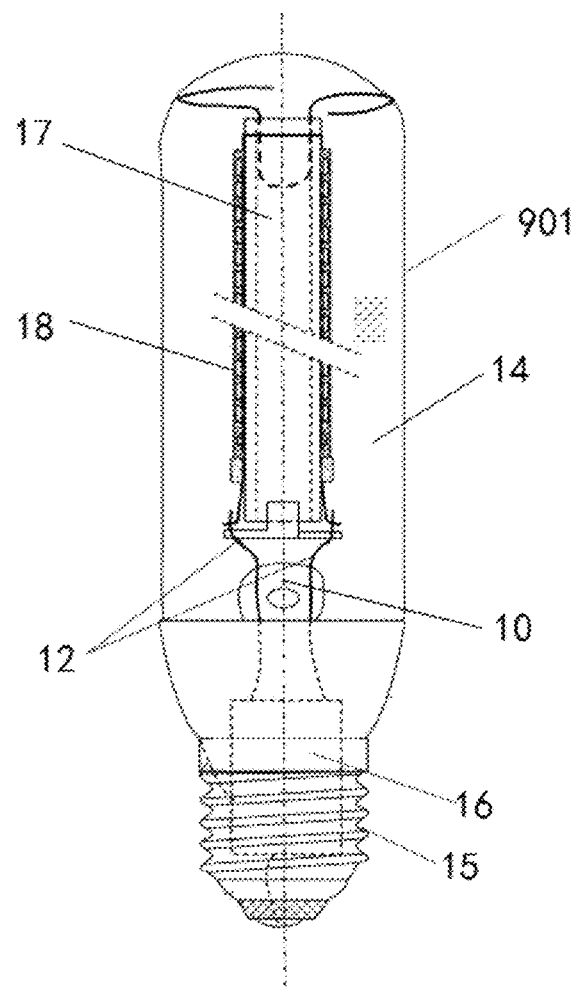
FIG. 18 is a schematic structure diagram of another LED illuminating lamp provided by the present invention.
Figure 19:
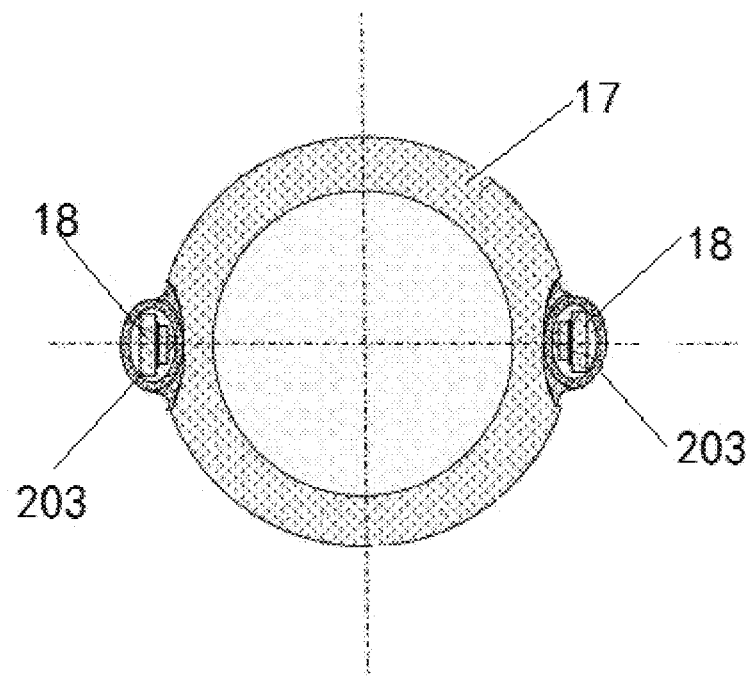
FIG. 19 is a sectional view of another LED illuminating lamp provided by the present invention.

Referring to FIG. 18 and FIG. 19, the present invention also provides an LED illuminating lamp, including a light-transmissive bulb shell (901) and a core column (10); the light-transmissive bulb shell (901) and the core column (10) are sealed together to form a vacuum sealed cavity (14). A transparent ceramic tube (17) having a high thermal conductivity coefficient is fixed on the core column (10), at least one string of LED flip chips (18) of the same luminous color or different luminous colors is attached to the transparent ceramic tube (17), and the LED flip chip (18) is coated with the second fluorescent glue (203). A portion of heat generated by the LED flip chip (18) is conducted through the transparent ceramic tube (17) having a high thermal conductivity coefficient, and the other portion is converted into an infrared wave by the second fluorescent glue (203), and is dissipated through the light-transmissive bulb shell (901).

Advantageous effects of the present invention include:

The disclosure of the present invention is good in heat dissipation effect. The present invention provides a fluorescent glue for an LED lighting bar and the LED bulb lamp, wherein the fluorescent glue combined with the heat radiation material can directly convert heat generated by an LED chip and the fluorescent glue into infrared waves of 2 to 20 μm, which are radiated into the surrounding environment, without additionally providing a heat dissipating device or spraying a heat dissipating coating. Further, after the light-emitting surface of the LED lighting bar is coated with the fluorescent glue provided by the present invention, heat is directly dissipated by the fluorescent glue without providing a heat dissipation layer on the back of a substrate for realizing 4π light emitting. And the LED lighting bar coated with the fluorescent glue provided by the present invention has good heat dissipation performance, which not only solves the problem of poor heat dissipation performance of the existing 4π light-emitting LED lighting bar, but also solves the problem that the existing 2π light-emitting LED lighting bar can only emit light at 180 degrees.

Furthermore, the LED bulb lamp provided by the present invention is provided with a fluorescent glue for an LED lighting bar as described above on the light-emitting surface of the built-in LED lighting bar. On the one hand, heat can be converted into an infrared wave of 2 to 20 μm first, and then transmitted to the surrounding environment through a silicate-based glass bulb shell having an infrared transmittance larger than 0.8. On the other hand, the heat can also be conducted to the glass bulb shell by gas convection through a high thermal-conductive gas medium in the bulb shell, so as to be conducted into the surrounding environment, thereby achieving all-round heat dissipation.

The disclosure of the present invention has high luminous efficiency. The heat radiation material in the fluorescent glue described in the present invention has a high refractive index and a small particle size, and does not affect the light emission of LEDs. Further, the heat radiation material can form a scattering particle layer, so as to enhance the heat dissipation intensity of blue light, so that the blue light is re-reflected as much as possible, and complementary color particles of the blue light are excited to emit light, thereby increasing the luminous efficiency.

It is to be understood that the application of the present invention is not limited to the above examples, and a person of ordinary skill in the art can make modifications or changes in accordance with the above description, all of which are within the scope of protection of the appended claims of the present invention.

What is claimed is:

1. A fluorescent glue for an LED lighting bar, the fluorescent glue is used to coat on light-emitting surface of LED lighting bar, comprising:
   a phosphor;
   a heat radiation material having a refractive index larger than 1.4 and a heat emissivity larger than 0.8; and a colloid;

the heat radiation material accounts for 0.5% to 10% by weight of the fluorescent glue, the phosphor accounts for 25% to 45% by weight of the fluorescent glue, and the colloid accounts for 45% to 74.5% by weight of the fluorescent glue;

the heat radiation material having a refractive index larger than 1.4 and a heat emissivity larger than 0.8 is formed by covalently bonding mica powder with one or more of boron nitride, aluminum oxide, silicon oxide or calcium fluoride.

2. The fluorescent glue for an LED lighting bar according to claim 1, wherein the phosphor is any combination of YAG-series yellow powder, YAG-series yellow green powder, or silicate-series yellow powder, silicate-series yellow green powder, silicate-series orange powder, or nitride-series red powder, nitrogen oxide-series red powder, or YAG-series phosphors, silicate-series phosphors, nitride-series phosphors, and oxynitride-series phosphors, and the phosphor has a particle size of 5 to 20 μm.

3. The fluorescent glue for an LED lighting bar according to claim 1, wherein the colloid is selected from one or more of an organic silica gel, an epoxy resin, a modified epoxy resin, a plastic, a transparent glue, a transparent paint and a polymer.

4. The fluorescent glue for an LED lighting bar according to claim 1, wherein the colloid is a methyl-based organic silica gel or a phenyl-based organic silica gel.

5. The fluorescent glue for an LED lighting bar according to claim 1, further comprising at least one additive of a dispersing agent, an assistant dispersing agent, a coupling agent, and an anti-sludging agent.

6. An LED bulb lamp, comprising:

a sealed light-transmissive bulb shell;

an LED lighting bar located in the light-transmissive bulb shell;

a high thermal-conductive gaseous medium located inside the light-transmissive bulb shell;

a light-emitting surface of the LED lighting bar is provided with a fluorescent glue for an LED lighting bar according to claim 1, and the high thermal-conductive gaseous medium is helium gas, or hydrogen gas, or a mixed gas of helium gas and hydrogen gas.

7. The LED bulb lamp according to claim 6, wherein the light-transmissive bulb shell is a silicate-based glass bulb shell having an infrared transmittance larger than 0.8.

8. The LED bulb lamp according to claim 7, wherein the LED bulb lamp is an A-type bulb lamp, a G-type bulb lamp, a PAR-type bulb lamp, a T-type bulb lamp, a C-type bulb lamp, a P-type bulb lamp, a PS-type bulb lamp, a BR-type bulb lamp, an ER-type bulb lamp, a BRL-type bulb lamp or a street lamp.

* * * * *